United States Patent [19]

Osa et al.

[11] 4,255,501
[45] Mar. 10, 1981

[54] INTERNALLY REFLECTIVE, DYE SENSITIZED, WET-TYPE PHOTOCELL

[75] Inventors: Tetsuo Osa; Masamichi Fujihira, both of Sendai, Japan

[73] Assignee: President of Tohoku University, Miyagi, Japan

[21] Appl. No.: 87,945

[22] Filed: Oct. 25, 1979

[30] Foreign Application Priority Data

Oct. 31, 1978 [JP] Japan .................................. 53-134750

[51] Int. Cl.³ ....................... H01M 6/30; H01M 6/36
[52] U.S. Cl. .................................................. 429/111
[58] Field of Search ........................................ 429/111

[56] References Cited

U.S. PATENT DOCUMENTS

| | | | |
|---|---|---|---|
| 2,506,625 | 5/1950 | Woolley | 313/94 |
| 3,018,313 | 1/1962 | Gattone | 136/89 |
| 3,104,188 | 9/1963 | Moncrieff-Yeaates | 136/89 |
| 3,989,542 | 11/1976 | Clark | 429/111 |

OTHER PUBLICATIONS

J. Nasielski et al., "The Photo-electrochemistry of the Rhodamine B-Hydroquinone System At Optically Transparent Bubbling Gas Electrodes", *Electrochimica Acta*, vol. 23, pp. 605-611, (1978).

*Primary Examiner*—Aaron Weisstuch
*Attorney, Agent, or Firm*—Robert E. Burns; Emmanuel J. Lobato; Bruce L. Adams

[57] ABSTRACT

An internally reflective, dye sensitized, wet-type photocell suitably adaptable as a photosensitive element or a solar cell, comprising anodes and cathodes immersed in an electrolyte solution containing a reduction-oxidation agent and dye sensitizers. Each of the anodes is provided with a light inlet end adapted for the introduction of light into the interior thereof, and a surface layer portion of an n-type semiconductive substance so that light introduced through the light inlet end to the interior of the anode is reflected a plurality of times so as to absorb the energy of the light to generate a voltage. Thus, since the dye sensitizing effect is efficiently utilized, the photocell enables the conversion efficiency of photo energy to electric energy to improve sufficiently for practical uses.

5 Claims, 3 Drawing Figures

INTERNALLY REFLECTIVE, DYE SENSITIZED, WET-TYPE PHOTOCELL

BACKGROUND OF THE INVENTION

The present invention relates to a wet-type photocell which is capable of converting light energy to electric energy by making use of a dye sensitizing effect and also by introducing light photons into the interior of an anode to reflect therein the thus-introduced light photons a plurality of times. The present invention particularly relates to an internally reflective, dye sensitized, wet-type photocell suitably adaptable as a photosensitive element or a solar cell.

Dry-type photocells are well-known. These include, for example, so-called solar cells, in which a p-n junction is formed in the vicinity of the surface of a semiconductive crystal consisting mainly of silicon. However, such conventional solar cells have the drawback that the semiconductive substance used must be of high purity. As a corollary to this, such solar cells are expensive to manufacture and their application is thus restricted to special fields. They are accordingly not suitable as general energy conversion elements.

To compensate for such drawbacks of the above-described conventional dry-type solar cells, there has recently been considered the use of a wet-type photocell which functions sufficiently well even if an inexpensive semiconductor such as a sintered semiconductive material is employed.

However, in such wet-type photocells, which are the objects of such recent consideration, an anode made of any convenient semiconductive substance is subject to dissolution as a result of a photoelectrode reaction, thereby causing the problem that the life of the electrode material is reduced.

Of course, there are some exceptional examples of semiconductive electrodes which are almost free from such a dissolution problem. For example, there are known as such exceptional semiconductive substances tin oxide, titanium dioxide, strontium titanate and the like. All of these semiconductive substances, however, are responsive only to light in the ultraviolet region, and they therefore are accompanied by the problem that they are not adequate and suitable as a conversion element for solar photon energy which is extensively distributed in the visible and near-infrared regions.

For the reasons described above, some attempts have been made with a view to expanding to the longer wavelength side the responsive wavelength region of a stable semiconductive substance which is responsive only to ultraviolet rays and is free from the dissolution problem due to photoelectrode reactions. Each of such attempts makes use of the dye sensitizing effect. In other words, it attempts to convert the energy of photons of a wavelength which is too long to be absorbed by such a semiconductive substance, to electric energy by adding to an electrolyte solution a dye which absorbs photons of a wavelength longer than the characteristic absorption wavelength region of a semiconductive electrode.

In a wet-type photocell containing a dye sensitizer added to the electrolyte solution thereof, it has been found that the energy conversion efficiency of the energy of photons having a wavelength longer than the characteristic absorption wavelength of a semiconductive substance itself to electric energy is extremely low, as indicated clearly from the measurements of photo electromotive forces by using spectral light. Thus, it has been concluded that such wet-type photocells are not suited for practical applications.

As a cause for such a low conversion efficiency, it is known that dye which is dissolved in an electrolyte solution does not take part in the dye sensitizing; only dye which is adsorbed at the interface between the electrode and electrolyte solution contributes to the dye sensitizing effect. However, there has still not been proposed any method or means to solve the problem of low conversion efficiency.

SUMMARY OF THE INVENTION

The object of the present invention is to solve the above-described problems by the provision of an internally-reflective, dye sensitized, wet-type photocell which is adapted to convert with high efficiency the energy of photons to electric energy by introducing photons into the interior of each anode for the purpose of efficient utilization of the dye sensitizing effect and reflection of thus introduced light photons within the anode a plurality of times.

In order to achieve the above object, an internally reflective, dye sensitized, wet-type photocell according to the present invention is characterized in that the photocell is provided with anodes and cathodes immersed in an electrolyte solution containing a reduction-oxidation agent and dye sensitizers, each of the anodes including a light inlet end adapted for the introduction of light into the interior thereof and a surface layer portion of an n-type semiconductive substance so as to reflect thus introduced light through the light inlet end within the interior of the anode a plurality of times and to absorb the energy of the light to generate a voltage.

By the use of the above-described internally reflective, dye sensitized, wet-type photocell of the present invention, it is possible to improve sufficiently the conversion efficiency of photo energy to electric energy of a wet-type photocell which has previously been considered to be insufficient for practical use, and the feasibility of applying such conventional wet-type photocells to practical use is improved.

The internally reflective, dye sensitized, wet-type photocell according to the present invention is further characterized in that condensing lenses are disposed on the reservoir of the above-described electrolyte solution in the vicinity of the light inlet ends of the respective anodes.

Thus, in the internally reflective, dye sensitized, wet-type photocell of the present invention, light is allowed efficiently to enter the interior of each anode by the aid of its respective condensing lens, thereby avoiding a drawback of conventional wet-type photocells where light photons are absorbed by the dye dissolved in the electrolyte solution. This results in an improvement for that the energy of light photons is converted with high efficiency to electric energy without absorption of the energy of such light photons by the dye in the solution.

Furthermore, since such condensing lenses also serve as a lid for the reservoir of the electrolyte solution, the electrolyte solution is prevented from spilling out from the reservoir and the reservoir is also protected from the intrusion of external contaminants.

BRIEF DESCRIPTION OF DRAWINGS

Hereinafter, explanation will be made of an internally reflective wet-type photocell containing a dye sensitizer as a preferred embodiment according to the present invention with reference to the appended drawings, in which.

Figure 1:
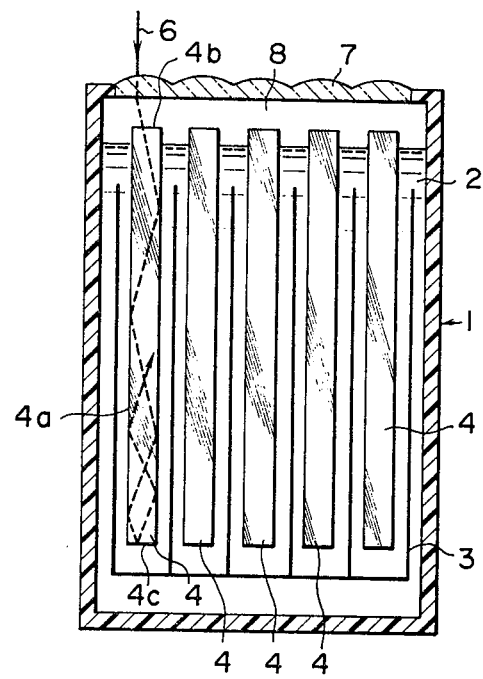
FIG. 1 is a longitudinal cross-sectional view thereof.

As is shown in FIG. 1, there is provided an electrolyte solution 2 containing a reduction-oxidation agent and a dye sensitizer in a cell receptacle 1 serving as a plastic reservoir. A plurality of cathodes 3 of platinum and anodes 4 are immersed in parallel in the electrolyte solution 2.

The dye sensitizer contained in the electrolyte solution 2 may be any dye as long as it provides a dye sensitizing effect. For example, the xanthene group dyes such as Rhodamine B, Rose Bengale, Eosine, Erythrosine and so on, cyanine group dyes such as quinocyanine, kryptocyanine and the like, basic dyes such as phenosafranine, Capri Blue, thionine, Methylene Blue and so on, porphyrin compounds such as chlorophyll, zinc porphyrin, magnesium porphyrin, etc., azo group dyes and anthraquinone group dyes are usable. The concentration of such a dye sensitizer in the electrolyte solution may range from $1 \times 10^{-6}$ mol/dm$^3$ to its respective saturated concentration but most effectively from $1 \times 10^{-4}$ to $10^{-3}$ mol/dm$^3$.

To the electrolyte solution is added an electrolyte such as sodium sulfate to improve ion conductivity. The electrolyte solution is further required to contain a reversible reduction-oxidation agent, for example, quinone-hydroquinone pairs.

The hydroquinone acts to reduce the oxidized dye, which is formed by electron donation to the semiconductive anode, after the photo-excitation thereof, to its original form. According to the above reaction, hydroquinone itself is oxidized to quinone which is then converted to hydroquinone by the reduction of the same at the cathodes made of, for example, platinum. In this electrolytic reaction, hydroquinone itself does not directly contribute to the light absorption but it serves to transfer electrons.

It is preferable in such an electrolyte solution to use as electrolyte concentration in the range of 1 to 0.1 mol/dm$^3$.

Furthermore, the concentration of the above-described reversible reduction-oxidation agent may range from $10^{-3}$ to $10^{-1}$ mol/dm$^3$, but the optimum concentration thereof is $10^{-2}$ mol/dm$^3$.

It is not necessary to add any reduction-oxidation agent such as the above-described quinone-hydroquinone pairs in case the electrolyte solution itself, for example water, acts as a reducing agent, forming oxygen at the anode and hydrogen by electron capture by protons at the cathode. In this case, besides the conversion of light photon energy to electric energy, its conversion to chemical energy, that is, generation of hydrogen and oxygen is simultaneously carried out.

Figure 2:
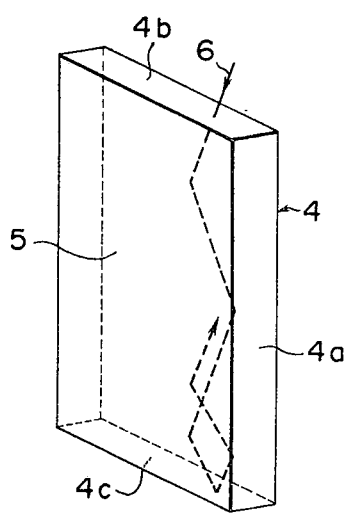
FIG. 2 is a perspective view showing one of the anodes in FIG. 1.

As is shown in FIG. 2, the anode 4 is formed of a main body comprising a plate-shaped optically transparent member 5. A film-like surface layer portion 4a, which is made of an n-type semiconductor, is formed on the surface of the optically transparent member 5. In addition, the upper end of the anode 4 is constructed in the form of a light inlet end 4b which allows the introduction of the light 6 into the anode interior. The light inlet end 4b of the anode 4 is maintained in an open state so that the light photons are readily allowed to enter the interior of the anode 4. Hence the n-type semiconductor film should not be applied to the light inlet end 4b, but preferably an anti-reflection film is applied.

With the provision of the above-described construction, it is possible to allow the light photons 6 which have passed through the light inlet end 4b, to be captured completely within the interior of the anode. Within the interior of the anode, the light photons 6 are absorbed by being reflected a plurality of times by the semiconductor layer 4a to generate electricity.

In addition, a reflection mirror 4c is attached to the bottom of the anode 4, which mirror 4c is capable of reflecting back to the surface layer 4a the light photons 6 which have been directed to the mirror 4c after being repeatedly reflected along the surface layer 4a.

It is necessary for the n-type semiconductive substance used for forming the surface layer 4a to be stable and free from any problem such as dissolution by a photoelectrode reaction when being radiated by light. For example, usable semiconductive substances may include tin oxide, titanium dioxide and strontium titanate.

The thickness of the optically transparent member 5 including the above-described n-type semiconductive surface layer 4a applied thereon is preferably of the order of 0.01 to 10 mm. The optically transparent member 5 may be made of any material as long as it has an optically transparent nature, for example, glass or quartz. Pyrex glass (a trademark) is an example of a preferred substance for forming the optically transparent member 5.

Any conventional method may be employed for forming the above-described semiconductive surface layer 4a on the optically transparent member 5. The thickness of the surface layer 4a is preferably of the order of 500 to several thousands of A and the optimum thickness is approximately 1000 A°.

The anode 4 can be of any shape provided that it allows the incident light photons 6 to make multiple reflections so as to absorb most of the energy of the incident light photons 6 in the semiconductor layer 4a. For example, the anode may be formed into a plate 4 such as shown in FIG. 2 or a cylinder 4' as depicted in FIG. 3.

Figure 3:
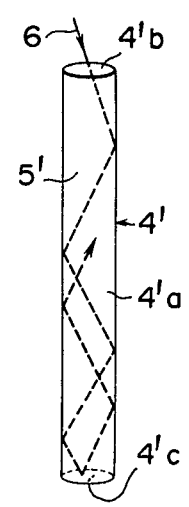
FIG. 3 is a perspective view depicting a modified embodiment of the anode in FIG. 2.

In FIG. 3, the symbol 4'a designates a thin film-like surface layer, consisting of an n-type semiconductive substance, which has been formed on a surface of the cylindrical optically transparent member 5'. The symbol 4'b indicates a light inlet end of the anode 4' and a reflection mirror is designated by the symbol 4'c.

The reflection mirrors 4c, 4'c may be made of a material employable for general optical equipment, for example, a metal film.

It has been determined experimentally that light reflection of 25, 50 and 100 times afford respectively 70, 90 and 99% light absorption. For example, in order to achieve a light absorption of 99%, it is required to reflect incident light photons 100 times. For causing such a number of light reflections, it is necessary to make the anode relatively long, whereby the requirement of size reduction of battery devices is not met.

However, the power output of a cell can be fully safisfied even if the light reflection is limited to 50 times, in other words, the degree of light absorption is 90%. The power output of a cell can also be raised by increasing the number of electrodes.

Supposing that the light reflection takes place about 50 times, the anode length would be, for example 137 mm and 343 mm respectively when its thickness is 2 mm and 5 mm.

In place of employing as anodes 4, 4', optically transparent members 5, 5' consisting, for example, of glass, quartz or the like and coated with the film-like surface layers 4a, 4'a of an n-type semiconductive substance, it is possible to form the anodes 4, 4' in their entirety with an n-type semiconductive substance such as tin oxide. Although the latter construction produces an advantage in reducing the electrical resistance of the anodes, the former construction is more practical if further consideration is exercised in view of their economical aspects and photo loss due to light scattering and other losses.

The cathode 3 is desirably made of or coated with a semiconductive substance from the viewpoint of increasing the power output of a cell. Since the anodes 4, 4' comprise an n-type semiconductive substance, it is necessary to use a p-type semiconductive substance for the cathode 3. However, in view of economic significance, it is usual to employ a material of good conductivity, for example, a metal or carbon.

As is shown in FIG. 1, in the top opening of the cell receptacle 1, condensing lenses 7 are disposed in the vicinity of the light inlet ends 4b of the respective anodes 4. The condensing lenses 7 are shaped in such a way that incident light is fully condensed and all thus-condensed light photons 6 reach the interiors of their respective electrodes (anodes) 4, and are disposed so as to avoid any loss of the light photons 6. Furthermore, the condensing lenses 7 also serve to protect the electrolyte solution 2 from being directly exposed to light and to avoid a photochemical reaction of the dye contained in the solution. The condensing lenses 7 also prevent the electrolyte solution 2 from spilling out and prevent the intrusion of external contaminants.

In FIG. 1, the numeral 8 designates a space between the anodes, electrolyte and the lenses, which is not absolutely necessary. The cathodes 3 and anodes 4 are connected to respective output leads (not shown) so as to permit connecting a voltage to be generated with a suitable load.

Since the wet-type photocell according to the present invention is constructed as described above, the light 6 which shines on the condensing lens 7 is condensed by the condensing lens 7 and then guided to the light inlet end 4b of the anode 4. Then, the light 6 entering the interiors of the anode 4 through the light inlet end 4b thereof is repeatedly reflected by the surface layer 4a a plurality of times within the anode 4 and thereafter reaches the reflection mirror 4c provided on the bottom of the anode 4, by which mirror 4c the light is reflected back and proceeds upwardly within the anode 4 while being repeatedly reflected by the surface layer 4a.

In the above-described manner, the energy of the light photons 6 is converted little by little to electric energy while being repeatedly reflected.

An example of the photocell of the above embodiment will now be explained in detail by referring to specific figures and names.

The anodes 4, 4' were Pyrex (a trademark) glass plates coated with a thin film of tin oxide (about 1000 A thickness) and platinum plates were employed as the cathodes 3.

The electrolyte solution was an aqueous solution of 0.2 mol/dm$^3$ sodium sulfate containing $1\times 10^{-3}$ mol/dm$^3$ Rhodamine B and $1\times 10^{-2}$ mol/dm$^3$ of a hydroquinone-quinone mixture (1:1 mixture).

Furthermore, the pH of the aqueous solution was maintained at 4 by a Briton-Robinson buffer solution. The anodes 4, 4' were designed in such a manner that multiple reflection of light was produced within the anodes 4, 4' so as to achieve on an average at least 50 reflections. With the above-described photocell, it was found that about 90% of the energy of the radiated light of about 570 mm was absorbed.

The quantum yield in the case of using Rhodamine B as the dye sensitizer and tin oxide anodes 4, 4' was about 20% and the apparent quantum yield for the radiated light of 570 nm was about 18%.

It may be feasible to make the inner wall of the cell receptacle 1 as a cathode, to attach the reflection mirror 4c on the inner bottom of the cell receptacle 1 and to extend the lower extremity of each anode 4 to the thus-formed reflection mirror 4c.

What is claimed is:

1. An internally reflective, dye sensitized, wet-type photocell equipped with anodes and cathodes which are immersed in an electrolyte solution containing a reduction-oxidation agent and a dye sensitizer, each of said anodes comprising an optically transparent member having a light inlet end adapted to allow the entry of light into the interior of the anode, and a thin film-like surface layer of an n-type semiconductive substance adapted to absorb the light and to generate electricity by reflecting the light entered through the light inlet end a plurality of times within said anode.

2. The photocell according to claim 1, in which each of said anodes is provided on the bottom end thereof with a reflection mirror which is adapted to reflect back to said surface layer the light guided to the reflection mirror while being repeatedly reflected along the surface layer.

3. An internally reflective, dye sensitized, wet-type photocell comprising anodes and cathodes which are immersed in an electrolyte solution containing a reduction-oxidation agent and a dye sensitizer in a reservoir, each of said anodes comprising an optically transparent member having a light inlet end adapted to allow the entry of light into the interior of the anode and a thin film-like surface layer of an n-type semiconductive substance adapted to absorb the light and to generate electricity by reflecting the light entered through the light inlet end a plurality of times within said anode, and condensing lenses provided on the reservoir in the vicinity of the light inlet ends of the respective anodes.

4. The photocell according to claim 3, in which each of said anodes is provided at its bottom end with a reflection mirror which reflects light back up said anode.

5. The photocell according to claim 3, in which said condensing lenses comprise a closure for said reservoir.

* * * * *